United States Patent

[11] 3,629,609

[72] Inventors Richard Alan Pedersen
Allentown, Pa.;
Ray Allen Reed, Aurora; Milton Dean
Underwood, Geneva, both of Ill.

[21] Appl. No. 12,997
[22] Filed Feb. 20, 1970
[45] Patented Dec. 21, 1971
[73] Assignee Bell Telephone Laboratories, Incorporated
Murray Hill, N.J.

[54] TTL INPUT ARRAY WITH BYPASS DIODE
5 Claims, 3 Drawing Figs.

[52] U.S. Cl. .......... 307/203, 307/215, 307/237, 307/299
[51] Int. Cl. .......... H03k 19/08, H03k 19/36
[50] Field of Search .......... 307/213, 215, 299 A, 300, 230, 203

[56] References Cited

UNITED STATES PATENTS

| | | | |
|---|---|---|---|
| 3,233,125 | 2/1966 | Buie | 307/299 X |
| 3,312,833 | 4/1967 | Durrett | 307/230 |

*Primary Examiner*—Donald D. Forrer
*Assistant Examiner*—John Zazworsky
*Attorneys*—R. J. Guenther and Kenneth B. Hamlin

ABSTRACT: A transistor-transistor logic gate characterized by a low inverse alpha current and high noise margins includes a multiemitter input array and a unique biasing arrangement. This arrangement comprises a diode-connected transistor in combination with a pair of resistors connected across the base-collector junction of the multiemitter transistor for maintaining an optimum biasing voltage across the base-collector junction of the multiemitter transistor regardless of the value of signals applied at the emitters thereof.

INVENTORS R.A. PEDERSEN
R.A. REED
M.D. UNDERWOOD
BY Lucian C. Canepa
ATTORNEY

TTL INPUT ARRAY WITH BYPASS DIODE

BACKGROUND OF THE INVENTION

1. Field of the Invention

This invention relates to multiemitter transistor logic circuits exhibiting an improved noise margin.

2. Prior Art

Transistor-Transistor Logic (TTL) circuits are well known in the art. See, for example, *Pulse, Digital and Switching Waveforms* by Millman and Taub, McGraw-Hill Inc., 1965, pp. 357–358. FIG. 9–52*b* of the Millman and Taub reference shows a typical TTL gate in which a number of input signals are applied, one at each emitter of a multiemitter transistor. A multiemitter transistor so arranged is frequently referred to as an input array.

The immunity of logic circuits to spurious signals is generally referred to in terms of the circuit's noise margins. These noise margins are defined relative to a threshold which is itself defined as the level of the voltage applied at the input of the gate required to produce a signal at the output of that gate.

The first noise margin, or low-level noise margin, is the difference between the maximum low-level input signal voltage and the threshold voltage. Analogously, the second, or high-level noise margin, is the difference between the minimum high-level voltage and the threshold voltage. Further, the signal swing of the circuit is defined as the difference between the maximum high-level voltage and the minimum low-level input signal voltage.

To improve the performance of logic circuits, then, it is desirable to maximize both noise margins and to minimize signal swing. As will be seen from the following discussion, the circuit of the present invention advantageously achieves the optimum trade-off among these figures of merit.

One of the problems involved in optimizing these parameters which has heretofore limited widespread use of TTL input arrays is the so-called inverse alpha ($\alpha_I$) problem. The $\alpha_I$ of a transistor is defined as the small signal current transfer ratio from collector to emitter with the output *a–c* short circuited at low current and voltage levels. Characteristically, when the base-collector junction of a multiemitter transistor is forward biased and the base-emitter junction is reverse biased (as in TTL input arrays), current flows in the transistor in a direction opposite to that of normal flow. $\alpha_I$, the transfer ratio of this inverse current, is a function of the semiconductor material of which the transistor is composed and the biasing conditions on the transistor.

Minimization of the $\alpha_I$ current has been partially achieved in prior art circuits by means of a base-collector bypass resistor connected across the base-collector junction of the multiemitter transistor. This resistor reduces the current in the multiemitter transistor by several orders of magnitude, thereby limiting the inverse current flowing in the transistor. However, in reducing leakage currents to very low levels by mans of a bypass resistor, the threshold voltage is inadvertently reduced also. Reduction in threshold implies degradation of the circuit low noise margin which is, as indicated, objectionable in most, if not all, TTL applications. A discussion of the choice of resistor values for this prior art circuit is included in an article titled "Transistor-Transistor Logic with High Packing Density and Optimum Performance at High Inverse Gain" by B. T. Murphy and V. J. Glinski appearing in the *IEEE Journal of Solid-State Circuits*, Sept. 1968, p. 261 et seq.

SUMMARY OF THE INVENTION

It is therefore an object of the present invention to improve transistor circuits.

More specifically, an object of this invention is to provide an improved TTL circuit which is characterized by a low level of inverse alpha leakage current.

Another object of the present invention is to provide a reliable gate utilizing a multiemitter logic input array and having reduced levels of inverse alpha leakage current and improved noise margins.

These and other objects of the present invention are realized in a specific illustrative embodiment that comprises a multiemitter transistor, a diode-connected transistor and a voltage divider. Basically, the diode-connected transistor provides a compensating voltage source for maintaining the base-collector voltage of the multiemitter transistor at a suitable level regardless of changes in input signal levels.

It is therefore a feature of the present invention that a diode-connected transistor be provided to more favorably bias the base-collector junction of a TTL input array.

It is another feature of the present invention that a voltage divider be provided in combination with a diode-connected transistor for biasing the base-collector junction of a TTL input array.

BRIEF DESCRIPTION OF THE DRAWING

A complete understanding of the present invention and of the above and other objects, features, and advantages thereof may be gained from a consideration of the following detailed description in conjunction with the accompanying drawing in which.

DETAILED DESCRIPTION

Figure 1A:
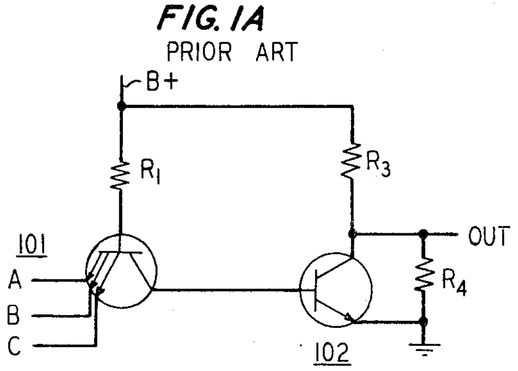
FIG. 1A PRIOR ART
FIGS. 1A and 1B illustrate prior art arrangements that exhibit high degradation of noise margins.
Figure 1B:
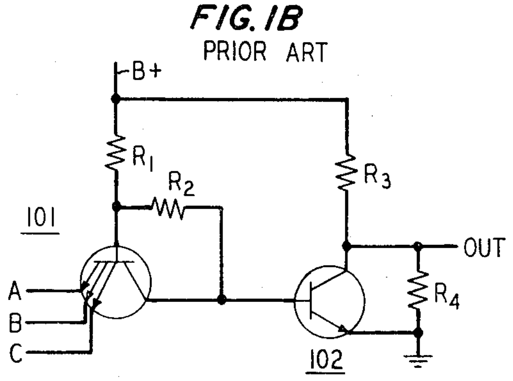
FIG. 1B PRIOR ART
Figure 2:
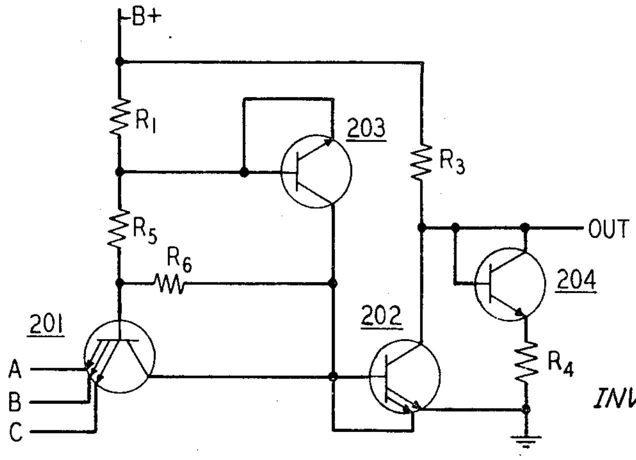
FIG. 2 depicts a specific illustrative circuit made in accordance with the principles of the present invention.

The circuits of both the prior art and the preferred embodiment of the present invention shown in FIGS. 1A, 1B, and 2 include multiemitter transistors. Transistors having plural emitters are well known in the art. See, for example, "A New Active Device Suitable for Use in Digital Circuits," by B. A. Boulter, Electronics Engineering, Vol. 35, No. 420, pp. 86–91, Feb. 1963.

The circuit of the prior art, illustrated in FIG. 1A, is a typical NAND logic gate including a TTL input array. In accordance with this circuit, when one or more input signals incident on the emitters of transistor 101 are low and the remainder are high, transistor 101 is saturated with a high base drive and has essentially zero forward collector current. The injection of electrons from the forward-biased collector-base junction of transistor 101 results in some collection at high emitters, thus reducing the "high" voltage level of the stages driving the high emitters and increasing the load on the stages driving the low emitters.

The addition of a base-collector bypass resistor such as $R_2$ reduces the prior art circuit of FIG. 1A to that of FIG. 1B and results in improved performance over that of the circuit of FIG. 1A. This improved performance is a result of the fact that a part of the base drive current is diverted from the base of transistor 101. The current so diverted flows through resistor $R_2$ and into the collector of transistor 101. This reduction of current flow into the base of transistor 101 significantly reduces the injection of electrons into the base and, hence, the collection of electrons by the high emitters.

Similarly, when all the input signals at the emitters of transistor 101 in FIG. 1A approach a high level, the base-emitter junctions are reverse biased to cutoff and the base-collector forward bias of transistor 101 decreases. Under these biasing conditions, transistor 101 operates in the inverse active region. Current of a magnitude $\alpha_I I_C$ (where $I_C$ is the collector current in transistor 101) flows into the high emitters, thereby degrading the "one" (or high) voltage level of the stages driving the high emitters. Again, the addition of resistor $R_2$ as in FIG. 1B effects a reduction of the forward bias across the base-collector junction of transistor 101 which, in turn, reduces the flow of inverse alpha current into the high emitters.

In the prior art circuit of FIG. 1B, as mentioned $R_2$ has been used to bypass current to control the forward biasing of the base-collector junction of transistor 101. However, with the desired low B+ supply, the design of the resistor ratio $R_2/R_1$ is such that, to limit the circuit inverse alpha current to low values the threshold voltage of the circuit must be reduced significantly. That is, the introduction of $R_2$ to reduce $\alpha_I$ has the effect of increasing $V_{CE}$ of the input array and hence reducing the gate threshold. As indicated above, reduction of the threshold voltage implies reduction of the low-level noise margin, an undesirable feature. In particular, when $R_2$ is included as shown in FIG. 1B, the input transistor 101 remains in the active region and has a voltage gain, $G$, given by $G=\Delta V_{CE}/\Delta V_{IN}=R_2/R_1$. Thus, with $R_2/R_1$ chosen to appreciably reduce $\alpha_I$, $V_{CE}$ of the input transistor increases rapidly as the input signals are increased.

A complete discussion of the prior art circuit of FIG. 1B is included in B. T. Murphy, U.S. Pat. No. 3,413,495, issued Nov. 26, 1968.

FIG. 2 illustrates a preferred embodiment of the present invention which includes an improvement over the prior art circuits of FIGS. 1A and 1B. In accordance with the circuit of FIG. 2, a first resistor $R_5$ is connected between biasing resistor $R_1$ and the base of transistor 201, and a second resistor $R_6$ is connected across the base-collector junction of transistor 201. In addition, a diode-connected transistor 203 is connected between the junction of resistors $R_1$ and $R_5$ and the collector of transistor 201. Diode-connected transistors are well known in the art, see, for example, *Integrated Silicon Device Technology, Vol. VIII by R. M. Burger, Research Triangle Institute*, 1966, pp. 105–107. Alternatively, any diode (other than a diode-connected transistor) having suitable characteristics may be substituted for diode-connected transistor 203.

Referring to the preferred circuit of FIG. 2, diode-connected transistor 203 is conveniently arranged to have its emitter and base short circuited. In this configuration diode-connected transistor 203 is effectively reduced to the base-collector junction of the transistor from which the diode was derived. Furthermore, since transistor 201 and the transistor from which diode-connected transistor 203 was derived are conveniently chosen to have substantially identical characteristics, diode-connected transistor 203, in the configuration of FIG. 2, effectively matches the base-collector junction of transistor 201 as to material, process and temperature characteristics.

It is noted that the preferred circuit of the present invention as shown in FIG. 2 is particularly adaptable to integrated circuit manufacturing techniques. Transistor 201 and diode-connected transistor 203 can be easily matched if fabricated together in accordance with well-known integrated circuit methods. See, for example, the above-cited Murphy-Glinski article.

When one or more of the input signals are low, the circuit of FIG. 2 achieves the same effect as the circuit of FIG. 1B in that the inverse alpha leakage current is decreased by reducing the base drive to transistor 201. As indicated above, however, the $V_{CE}$ of the circuit of FIG. 1B increases with increasing input signal according to the relationship, $\Delta V_{CE}=(R_2/R_1)\Delta V_{IN}$, thereby causing a large degradation of the circuit threshold in response to small increments of the input signal. It is apparent, then, that preventing $V_{CE}$ from increasing in response to an increasing input signal will avoid the degradation in threshold incident thereto.

The circuit of 2, the preferred circuit of the present invention, effectively controls the increase in $V_{CE}$ by controlling the $V_{BC}$ (the voltage across the base-collector terminals of transistor 201). It can be readily shown that $V_{CE}$ increases with increasing $V_{BC}$. Thus, in accordance with the circuit of FIG. 2, the voltage divider-diode combination, including resistors $R_5$, $R_6$ and diode-connected transistor 203, clamps $V_{BC}$ to a value approximately equal to $$\frac{R_6}{R_5+R_6} V_D,$$

where $V_D$ is the forward voltage drop across diode-connected transistor 203.

More specifically, in the circuit of FIG. 2, when one or more of the input signals are low, current flows into resistor $R_1$. This current is then divided between the path including diode-connected transistor 203 and the path including resistors $R_5$ and $R_6$. The currents through these paths then recombine at the junction of diode-connected transistor 203 and resistor $R_6$. The recombined current then flows through transistor 201 to the essentially grounded terminal provided by the low signal source. When the last low input signal goes high, a reduced amount of current flows from the B+ supply into $R_1$. However, because of the existence of diode-connected transistor 203, a reduced amount of current flows through it, thereby maintaining the current in the path including resistors $R_5$ and $R_6$ relatively constant. Diode-connected transistor 203 maintains a forward voltage drop, $V_d$, which is constant over a considerable range of current values.

Clamping $V_{BC}$ in this manner prevents $V_{CE}$ from increasing beyond a prescribed limit. Hence, when the last of the input signals to transistor 201 goes high, $V_{CE}$ does not increase inordinately, thereby preventing the threshold degradation incident to that increase. Clearly, then, the circuit of FIG. 2 limits the undesirable inverse alpha current as does the circuit of FIG. 1B, but without the resulting degradation in low-level noise margin inherent in that prior art circuit.

In addition, the gate circuit of FIG. 2 includes further modifications intended to optimize the performance of the circuit. The first of these modifications involves the use of a diode clamp 204 (advantageously, a diode-connected transistor) to maximize the circuit's capacitive drive capability on positive-going transitions.

The above-described circuit is a preferred embodiment of the present invention only. Clearly, modifications and changes may be made in the circuit shown and in the parameters listed above without departing from the spirit and scope of the present invention. The second modification is the utilization of an emitter clamp on transistor 202. In accordance with this second modification, excess base current in transistor 202 is diverted to ground.

The circuit of FIG. 2 has been fabricated in accordance with the collector-diffusion isolated (CDI) process described in an article by B. T. Murphy et al., titled "Collector Diffusion Isolated Integrated Circuits," appearing in the *Proceedings of the IEEE*, Sept. 1969, pp. 1,523–1,527. Typical values for the components and parameters of a circuit as in FIG. 2 fabricated in accordance with the CDI process are:

| | |
|---|---|
| $R_1$ | 1,685 ohms |
| $R_3$ | 2,200 ohms |
| $R_4$ | 300 ohms |
| $R_5$ | 180 ohms |
| $R_6$ | 825 ohms |
| | 3 volts |

where the inverse alpha leakage current is 4.9 microamperes with a low level input signal of zero volts and a high level input signal of three volts and where the gate threshold is 0.585 volt.

What is claimed is:

1. In a logic gate,
   a. a transistor having base and collector terminals and at least one emitter terminal,
   b. a source of DC potential,
   c. a biasing resistor having first and second terminals, said first terminal being connected to said source of DC potential,
   d. first means having first and second terminals for controlling the bias at said collector terminal, said first terminal of said first means being connected to said second terminal of said resistor, and said second terminal of said first means being connected to said collector terminal wherein said first means includes a diode,
   e. second means having first and second terminals for applying bias signals at said base terminal, said first terminal of said second means being connected to said second terminal of said resistor, and said second terminal of said second means being connected to said base terminal, and f. third means having first and second terminals for bypassing a portion of said bias signals at said base terminal, said first terminal of said third means being connected to said base terminal, and said second terminal of said third means being connected to said collector terminal.

2. A circuit as in claim 1 wherein said diode is a diode-connected transistor having material, manufacturing process and temperature characteristics substantially identical to those of said transistor.

3. In combination in a transistor logic gate a. a first multiemitter transistor, b. a source of DC potential, c. a point of reference potential, d. first and second series-connected resistors coupling said source of DC potential to the base of said first multiemitter transistor, e. a first diode connected between the junction of said first and second resistors and the collector of said first multiemitter transistor, f. a third resistor connected between the base and collector of said first multiemitter transistor, g. a second multiemitter transistor, h. a fourth resistor connecting said source of DC potential to the collector of said second multiemitter transistor, i. means connecting the base of said second multiemitter transistor to the collector of said first multiemitter transistor, j. means connecting one emitter of said second multiemitter transistor to the base of said second multiemitter transistor, k. means connecting a second emitter of said second multiemitter transistor to said point of reference potential, and l. a network comprising a diode and a resistor connected in series, said network being connected between the collector of said second multiemitter transistor and said point of reference potential, said network being arranged to control the voltage at said collector of said second multiemitter transistor.

4. In a logic gate responsive to a plurality of sources of logic signals, a. a transistor having base and collector terminals and a plurality of emitter terminals, b. said plurality of sources of logic signals each arranged to apply logic signals to a corresponding one of said emitter terminals, c. a source of DC potential, d. a bias resistor having first and second terminals, said first terminal being connected to said source of DC potential, and e. first means including a diode saturable in response to high-level signals on all of said emitter terminals, for controllably applying bias signals from said second terminal of said bias resistor to said base and collector terminals, thereby limiting undesired inverse internal currents from said collector terminal to one or more of said emitter terminals while maintaining the logic threshold at each of said emitter terminals at a satisfactory level.

5. Apparatus as in claim 4 wherein said first means clamping further comprises a voltage divider for applying across said base and collector terminals a portion of the voltage drop across said diode.

* * * * *